United States Patent
McCollum

(10) Patent No.: US 10,522,224 B2
(45) Date of Patent: Dec. 31, 2019

(54) CIRCUITRY AND METHODS FOR PROGRAMMING RESISTIVE RANDOM ACCESS MEMORY DEVICES

(71) Applicant: Microsemi SoC Corp., San Jose, CA (US)

(72) Inventor: John L. McCollum, Orem, UT (US)

(73) Assignee: Microsemi SoC Corp., San Jose, CA (US)

( * ) Notice: Subject to any disclaimer, the term of this patent is extended or adjusted under 35 U.S.C. 154(b) by 0 days.

(21) Appl. No.: 16/037,417

(22) Filed: Jul. 17, 2018

(65) Prior Publication Data

US 2019/0051352 A1 Feb. 14, 2019

Related U.S. Application Data

(60) Provisional application No. 62/544,642, filed on Aug. 11, 2017.

(51) Int. Cl.
*G11C 11/00* (2006.01)
*G11C 13/00* (2006.01)
(Continued)

(52) U.S. Cl.
CPC .......... *G11C 13/0069* (2013.01); *G11C 5/063* (2013.01); *G11C 13/003* (2013.01); *G11C 13/004* (2013.01); *G11C 13/0011* (2013.01); *G11C 13/0028* (2013.01); *G11C 13/0064* (2013.01); *G11C 13/0097* (2013.01); *H01L 27/2436* (2013.01); *H01L 27/2454* (2013.01); *H01L 45/085* (2013.01); *H01L 45/1266* (2013.01); *G11C 2013/0045* (2013.01); *G11C 2013/0071* (2013.01); *G11C 2013/0073* (2013.01); *G11C 2013/0078* (2013.01); *G11C 2013/0092* (2013.01); *G11C 2213/82* (2013.01)

(58) Field of Classification Search
CPC ..... G11C 13/0069; G11C 5/063; G11C 11/00; G11C 13/0011; G11C 13/0028; G11C 13/003; G11C 13/004
USPC ........................................ 365/148, 158, 163
See application file for complete search history.

(56) References Cited

U.S. PATENT DOCUMENTS

| 4,904,338 A | 2/1990 | Kozicki |
| 5,229,963 A | 7/1993 | Ohtsuka et al. |

(Continued)

FOREIGN PATENT DOCUMENTS

| WO | 2017106523 A1 | 6/2017 |
| WO | 2018106450 A1 | 6/2018 |

OTHER PUBLICATIONS

PCT/US2018/042422, International Search Report and Written Opinion, dated Jan. 4, 2019.

(Continued)

*Primary Examiner* — Harry W Byrne
(74) *Attorney, Agent, or Firm* — Glass and Associates; Kenneth D'Alessandro; Kenneth Glass

(57) ABSTRACT

A method for programming a ReRAM cell including a ReRAM device connected in series with an access transistor includes biasing the ReRAM cell with a programming potential that configures the access transistor in a common-source configuration and applying at least one programming voltage pulse to a gate of the access transistor, the programming voltage pulse having a magnitude selected to limit programming current to a preselected value.

4 Claims, 10 Drawing Sheets

(51) Int. Cl.
*H01L 27/24* (2006.01)
*H01L 45/00* (2006.01)
*G11C 5/06* (2006.01)

(56) References Cited

U.S. PATENT DOCUMENTS

| | | | |
|---|---|---|---|
| 5,254,866 A | 10/1993 | Ogoh | |
| 5,314,772 A | 5/1994 | Kozicki et al. | |
| 4,758,745 B1 | 11/1994 | Elgamal, et al. | |
| 4,873,459 B1 | 1/1995 | Gamal, et al. | |
| 5,463,583 A | 10/1995 | Takashina | |
| 5,500,532 A | 3/1996 | Kozicki | |
| 5,537,056 A | 7/1996 | McCollum | |
| 5,542,690 A | 8/1996 | Kozicki | |
| 5,557,137 A | 9/1996 | Cohen | |
| 5,576,568 A | 11/1996 | Kowshik | |
| 5,587,603 A | 12/1996 | Kowshik | |
| 5,625,211 A | 4/1997 | Kowshik | |
| 5,682,389 A | 10/1997 | Nizaka | |
| 5,729,162 A | 3/1998 | Rouy | |
| 5,761,115 A | 6/1998 | Kozicki et al. | |
| 5,770,885 A | 6/1998 | McCollum et al. | |
| 5,801,415 A | 9/1998 | Lee et al. | |
| 5,812,452 A | 9/1998 | Hoang | |
| 5,896,312 A | 4/1999 | Kozicki et al. | |
| 5,914,893 A | 6/1999 | Kozicki et al. | |
| 5,986,322 A | 11/1999 | McCollum et al. | |
| 6,063,663 A | 5/2000 | Caprara et al. | |
| 6,084,796 A | 7/2000 | Kozicki et al. | |
| 6,100,560 A | 8/2000 | Lovett | |
| 6,137,725 A | 10/2000 | Tassan et al. | |
| 6,144,580 A | 11/2000 | Murray | |
| 6,222,774 B1 | 4/2001 | Tanzawa et al. | |
| 6,324,102 B1 | 11/2001 | McCollum | |
| 6,326,651 B1 | 12/2001 | Manabe | |
| 6,348,365 B1 | 2/2002 | Moore et al. | |
| 6,356,478 B1 | 3/2002 | McCollum | |
| 6,388,324 B2 | 5/2002 | Kozicki | |
| 6,418,049 B1 | 7/2002 | Kozicki et al. | |
| 6,437,365 B1 | 8/2002 | Hawley et al. | |
| 6,469,364 B1 | 10/2002 | Kozicki | |
| 6,487,106 B1 | 11/2002 | Kozicki | |
| 6,635,914 B2 | 10/2003 | Kozicki et al. | |
| 6,709,887 B2 | 3/2004 | Moore et al. | |
| 6,768,687 B2 | 7/2004 | Kaihatsu | |
| 6,784,476 B2 | 8/2004 | Kim et al. | |
| 6,798,692 B2 | 9/2004 | Kozicki et al. | |
| 6,815,784 B2 | 11/2004 | Park et al. | |
| 6,825,489 B2 | 11/2004 | Kozicki | |
| 6,847,073 B2 | 1/2005 | Kanaya | |
| 6,849,891 B1 | 2/2005 | Hsu et al. | |
| 6,864,500 B2 | 3/2005 | Gilton | |
| 6,865,117 B2 | 3/2005 | Kozicki | |
| 6,891,769 B2 | 5/2005 | McCollum et al. | |
| 6,914,802 B2 | 7/2005 | Kozicki | |
| 6,927,411 B2 | 8/2005 | Kozicki | |
| 6,940,745 B2 | 9/2005 | Kozicki | |
| 6,955,940 B2 | 10/2005 | Campbell et al. | |
| 6,970,383 B1 | 11/2005 | Han et al. | |
| 6,978,374 B1 | 12/2005 | Hansen et al. | |
| 6,985,378 B2 | 1/2006 | Kozicki | |
| 6,998,312 B2 | 2/2006 | Kozicki et al. | |
| 7,006,376 B2 | 2/2006 | Kozicki | |
| 7,061,036 B2 | 6/2006 | Kajiyama | |
| 7,078,295 B2 | 7/2006 | Jeon et al. | |
| 7,101,728 B2 | 9/2006 | Kozicki et al. | |
| 7,120,053 B2 | 10/2006 | Atsumi et al. | |
| 7,120,079 B2 | 10/2006 | McCollum et al. | |
| 7,126,837 B1 | 10/2006 | Banachowicz et al. | |
| 7,142,450 B2 | 11/2006 | Kozicki et al. | |
| 7,145,794 B2 | 12/2006 | Kozicki | |
| 7,169,635 B2 | 1/2007 | Kozicki | |
| 7,180,104 B2 | 2/2007 | Kozicki | |
| 7,187,610 B1 | 3/2007 | McCollum et al. | |
| 7,227,169 B2 | 6/2007 | Kozicki | |
| 7,232,717 B1 | 6/2007 | Choi et al. | |
| 7,245,535 B2 | 7/2007 | McCollum et al. | |
| 7,288,781 B2 | 10/2007 | Kozicki | |
| 7,294,875 B2 | 11/2007 | Kozicki | |
| 7,301,821 B1 | 11/2007 | Greene et al. | |
| 7,339,232 B2 | 3/2008 | Seo et al. | |
| 7,368,789 B1 | 5/2008 | Dhaoui et al. | |
| 7,372,065 B2 | 5/2008 | Kozicki et al. | |
| 7,385,219 B2 | 6/2008 | Kozicki et al. | |
| 7,402,847 B2 | 7/2008 | Kozicki et al. | |
| 7,405,967 B2 | 7/2008 | Kozicki et al. | |
| 7,430,137 B2 | 9/2008 | Greene et al. | |
| 7,499,360 B2 | 3/2009 | McCollum et al. | |
| 7,511,532 B2 | 3/2009 | Derharcobian et al. | |
| 7,519,000 B2 | 4/2009 | Caveney et al. | |
| 7,560,722 B2 | 7/2009 | Kozicki | |
| 7,675,766 B2 | 3/2010 | Kozicki | |
| 7,692,972 B1 | 4/2010 | Sadd et al. | |
| 7,728,322 B2 | 6/2010 | Kozicki | |
| 7,763,158 B2 | 7/2010 | Kozicki | |
| 7,816,717 B2 | 10/2010 | Ozaki | |
| 7,839,681 B2 | 11/2010 | Wang et al. | |
| 7,928,492 B2 | 4/2011 | Jeon et al. | |
| 7,929,345 B2 | 4/2011 | Issaq | |
| 8,269,203 B2 | 9/2012 | Greene et al. | |
| 8,269,204 B2 | 9/2012 | Greene et al. | |
| 8,415,650 B2 | 4/2013 | Greene et al. | |
| 8,531,866 B2 | 9/2013 | Ikegami et al. | |
| 8,598,560 B1 | 12/2013 | Milojevic et al. | |
| 8,735,211 B2 | 5/2014 | Greeley et al. | |
| 9,128,821 B2 | 9/2015 | Chen et al. | |
| 9,437,298 B1* | 9/2016 | Tomishima | G11C 14/009 |
| 9,646,692 B1 | 5/2017 | Lung et al. | |
| 9,704,573 B1 | 7/2017 | Hecht et al. | |
| 9,959,927 B2 | 5/2018 | Zhou et al. | |
| 2002/0003247 A1 | 1/2002 | Yokoyama et al. | |
| 2003/0107105 A1 | 6/2003 | Kozicki | |
| 2003/0222303 A1 | 12/2003 | Fukuda et al. | |
| 2004/0124407 A1 | 7/2004 | Kozicki et al. | |
| 2005/0141431 A1 | 6/2005 | Caveney et al. | |
| 2005/0201143 A1 | 9/2005 | Pinnow et al. | |
| 2005/0225413 A1 | 10/2005 | Kozicki et al. | |
| 2006/0028895 A1 | 2/2006 | Taussig et al. | |
| 2006/0050546 A1 | 3/2006 | Roehr | |
| 2006/0051927 A1 | 3/2006 | Takami et al. | |
| 2006/0086989 A1 | 4/2006 | Lee et al. | |
| 2006/0171200 A1 | 8/2006 | Rinerson et al. | |
| 2006/0230375 A1 | 10/2006 | Casey et al. | |
| 2006/0238185 A1 | 10/2006 | Kozicki | |
| 2006/0291364 A1 | 12/2006 | Kozicki | |
| 2007/0045728 A1 | 3/2007 | Lee | |
| 2007/0075352 A1 | 4/2007 | Irie et al. | |
| 2007/0108508 A1 | 5/2007 | Lin et al. | |
| 2007/0109861 A1 | 5/2007 | Wang et al. | |
| 2007/0121369 A1 | 5/2007 | Happ et al. | |
| 2007/0140029 A1* | 6/2007 | Kim | G11C 7/062 365/233.12 |
| 2007/0146012 A1 | 6/2007 | Murphy et al. | |
| 2007/0165446 A1 | 7/2007 | Oliva et al. | |
| 2007/0165532 A1 | 7/2007 | Retana et al. | |
| 2007/0176264 A1 | 8/2007 | Lee et al. | |
| 2008/0101117 A1 | 5/2008 | Ogura et al. | |
| 2008/0113560 A1 | 5/2008 | Caveney et al. | |
| 2008/0211540 A1 | 9/2008 | Fujita | |
| 2008/0279028 A1 | 11/2008 | McCollum et al. | |
| 2009/0034325 A1 | 2/2009 | Lowrey et al. | |
| 2009/0184359 A1 | 7/2009 | He et al. | |
| 2009/0198812 A1 | 8/2009 | Caveney et al. | |
| 2009/0283740 A1 | 11/2009 | Kozicki et al. | |
| 2010/0092656 A1 | 4/2010 | Kozicki | |
| 2010/0100857 A1 | 4/2010 | Chen et al. | |
| 2010/0135071 A1 | 6/2010 | Kozicki | |
| 2010/0149873 A1 | 6/2010 | Wang et al. | |
| 2010/0157688 A1 | 6/2010 | Issaq | |
| 2010/0169886 A1 | 7/2010 | Troxel et al. | |
| 2010/0208520 A1 | 8/2010 | Wang et al. | |
| 2011/0001108 A1 | 1/2011 | Greene et al. | |
| 2011/0001115 A1 | 1/2011 | Greene et al. | |
| 2011/0001116 A1 | 1/2011 | Greene et al. | |

(56) References Cited

U.S. PATENT DOCUMENTS

| | | |
|---|---|---|
| 2011/0002167 A1 | 1/2011 | McCollum et al. |
| 2011/0024821 A1 | 2/2011 | Wang et al. |
| 2011/0205780 A1 | 8/2011 | Yasuda et al. |
| 2012/0223381 A1 | 9/2012 | Lu et al. |
| 2012/0294064 A1* | 11/2012 | Kitagawa ............ G11C 13/0007 365/148 |
| 2013/0033921 A1 | 2/2013 | Tsuda et al. |
| 2013/0134378 A1 | 5/2013 | Liu |
| 2013/0175494 A1 | 7/2013 | Collins et al. |
| 2013/0234100 A1 | 9/2013 | An et al. |
| 2013/0242640 A1 | 9/2013 | Haukness et al. |
| 2013/0248797 A1 | 9/2013 | Sandhu et al. |
| 2013/0301337 A1 | 11/2013 | Kamalanathan et al. |
| 2014/0071745 A1 | 3/2014 | Kawasumi et al. |
| 2014/0151621 A1 | 6/2014 | Tendulkar et al. |
| 2014/0158968 A1 | 6/2014 | Jo et al. |
| 2014/0175531 A1 | 6/2014 | Huang et al. |
| 2014/0233301 A1 | 8/2014 | Lu et al. |
| 2014/0246719 A1 | 9/2014 | Dhaoui et al. |
| 2014/0264238 A1 | 9/2014 | Jo et al. |
| 2014/0269008 A1 | 9/2014 | Baker et al. |
| 2015/0029775 A1 | 1/2015 | Ravasio et al. |
| 2015/0076439 A1 | 3/2015 | Saitoh |
| 2015/0171323 A1 | 6/2015 | Hashim et al. |
| 2015/0179256 A1* | 6/2015 | Kitagawa ............ G11C 13/0069 365/148 |
| 2015/0206582 A1 | 7/2015 | Lam et al. |
| 2016/0172059 A1* | 6/2016 | Arslan ................ G11C 13/004 365/148 |
| 2016/0225443 A1 | 8/2016 | Chou et al. |
| 2016/0240251 A1 | 8/2016 | Shih et al. |
| 2017/0345496 A1* | 11/2017 | Liu ....................... G11C 11/161 |

OTHER PUBLICATIONS

Lian, et al., "Improved Resistive Switching Uniformity in Cu/HfO2/Pt Devices by Using Current Sweeping Mode", IEEE Electron Device Letters, vol. 32, No. 8, Aug. 2011.

Moriyama, et al., "Pulse Switching Property of Reset Process in Resistive Random Access Memory (ReRAM) Consisting of Binary-Transition-Metal-Oxides", The Electrochemical Society, Abstract #2830, Honolulu PRiME 2012.

Wang, et al., "Impact of program/erase operation on the performances of oxide-based resistive switching memory", Nanoscale Research Letters (2015) 10:39, Feb. 5, 2015.

Yang, "A 2Mb ReRAM with two bits error correction codes circuit for high reliability application", IEEE, 2013.

Aratani, et al., Aratani, K. "A Novel Resistance Memory with High Scalability and Nanosecond Switching," IEDM, 2007, pp. 783-786.

Baek, et al., Baek, I. G. et al., "Highly Scalable Non-volatile Resistive Memory using Simple Binary Oxide Driven by Asymmetric Uni-polar Voltage Pulses, Samsung Advanced Institute of Technology," IDEM 2004, 26 pages.

Burr, G. W. et al., "Overview of Candidate Device Technologies for Storage-class Memory," IBM Journal of Research & Development, 2008, vol. 52, No. 4/5, pp. 449-464.

Yi-Chung Chen et al.: "The 3-D Stacking Bipolar RRAM for High Density", IEEE Transactions on Nanotechnology, IEEE Service Center, Piscataway, NJ, US, vol. 11, No. 5, Sep. 1, 2012 (Sep. 1, 2012), pp. 948-956.

Choi, S. J. et al., "Improvement of CBRAM Resistance Window by Scaling Down Electrode Size in Pure-GeTe Film," IEEE Electron Device Letters, Feb. 2009, vol. 30, No. 2, pp. 120-122.

Fang, T. N. et al., "Erase Mechanism for Copper Oxide Resistive Switching Memory Cells with Nickel Electrode," Int'l Electron Devices Meeting, 2006, pp. 1-4.

Greene, Jonathan et al., "Antifuse Field Programmable Gate Arrays," Proceedings of the IEEE, Jul. 1993, vol. 81, No. 7, pp. 1042-1056.

Kund, Michael et al., "Conductive Bridging RAM (CBRAM): An Emerging Non-volatile Memory Technology Scalable to Sub 20nm," IEDM Technical Digest, Dec. 5, 2005, pp. 754-757, held in Washington, D.C.

Lemieux, G. et al., "Directional and Single-Driver Wires in FPGA Interconnect," International Conference on Field-Programmable Technology (ICFPT), Dec. 2004, pp. 41-48, Brisbane, Australia.

Meyer, R., "Scalable Non-volatile Cross-point Memory Based on Dual-layer Oxide Memory Elements," 9th Annual Non-volatile Memory Technology Symposium, Nov. 11-14, 2008, in Pacific Grove, CA, Unity Semiconductor Corporation, Sunnyvale, CA 94085, 41 pp.

Meyer, R. et al., "Oxide Dual-layer Memory Element for Scalable Non-volatile Cross-point Memory Technology," 9th Annual Non-volatile Memory Technology Symposium, Nov. 11-14, 2008, in Pacific Grove, CA, pp. 1-5.

Sakamoto, T. et al., "A/Ta2O5 Solid-Electrolyte Switch with Improved Reliabiltiy," 2007 IEEE Symposium on VLSI Technogy, Jun. 12-14, 2007, pp. 38-39, held in Kyoto, JP.

Strukov, Dimitri B. et al., "The Missing Memristor Found," Nature, May 1, 2008, vol. 453, pp. 80-85.

Symanczyk, Ralf, "Conductive Bridging Memory Devleopment from Single Cells to 2Mbit Memory Arrays," 8th Non-Volatile Memory Technology Symposium, Nov. 10-13, 2007, 25 pages.

Wei Yi et al: Feedback write scheme for memristive switching devices 11, Applied Physics A—Materials Science & Processing, Springer, Berlin, DE, vol. 102, No. 4, Jan. 27, 2011 (Jan. 27, 2011), pp. 973-982.

* cited by examiner

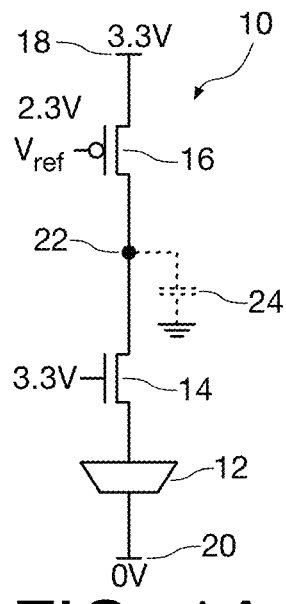
FIG. 1A
(PRIOR ART)
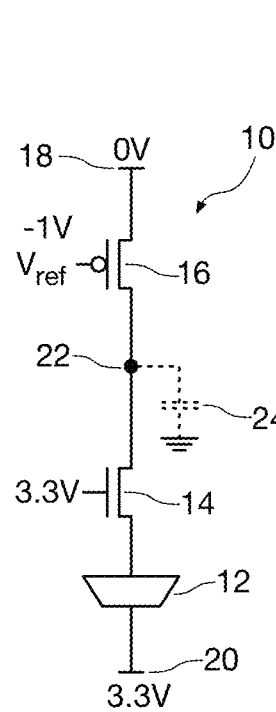
FIG. 1B
(PRIOR ART)
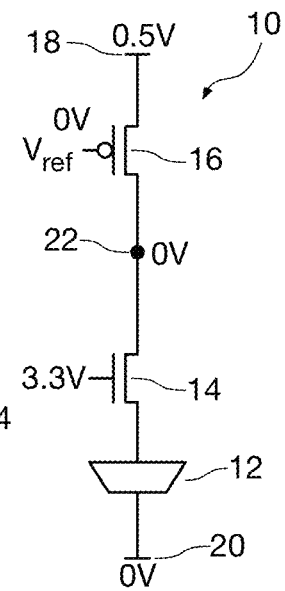
FIG. 1C
(PRIOR ART)
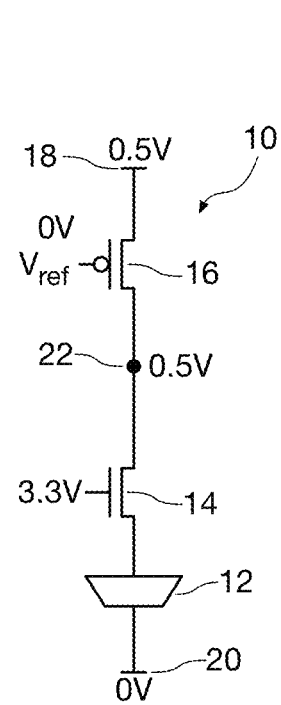
FIG. 1D
(PRIOR ART)
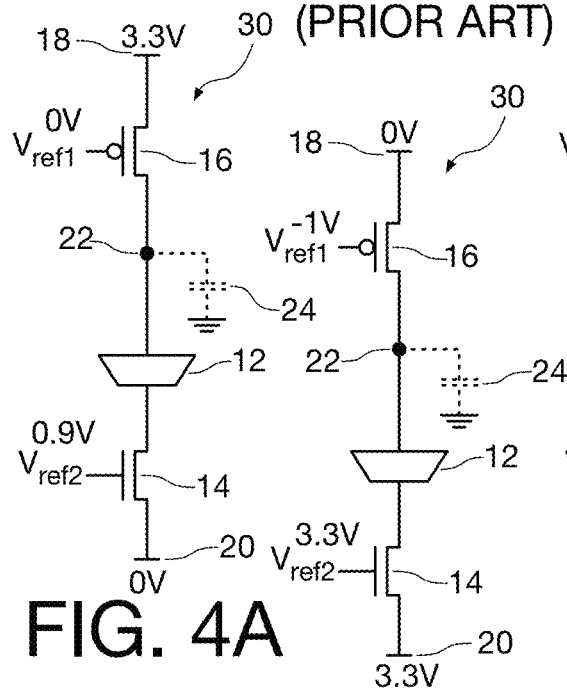
FIG. 4A
FIG. 4B
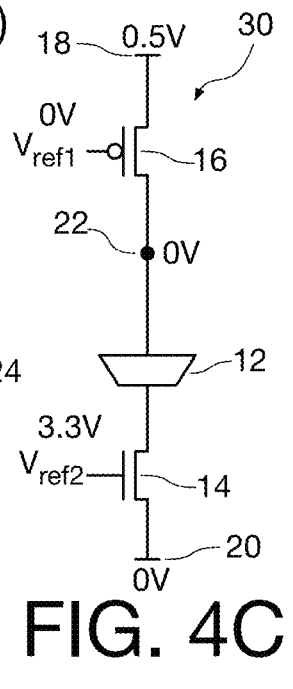
FIG. 4C
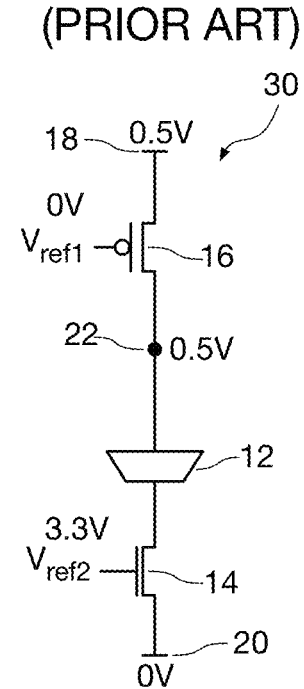
FIG. 4D

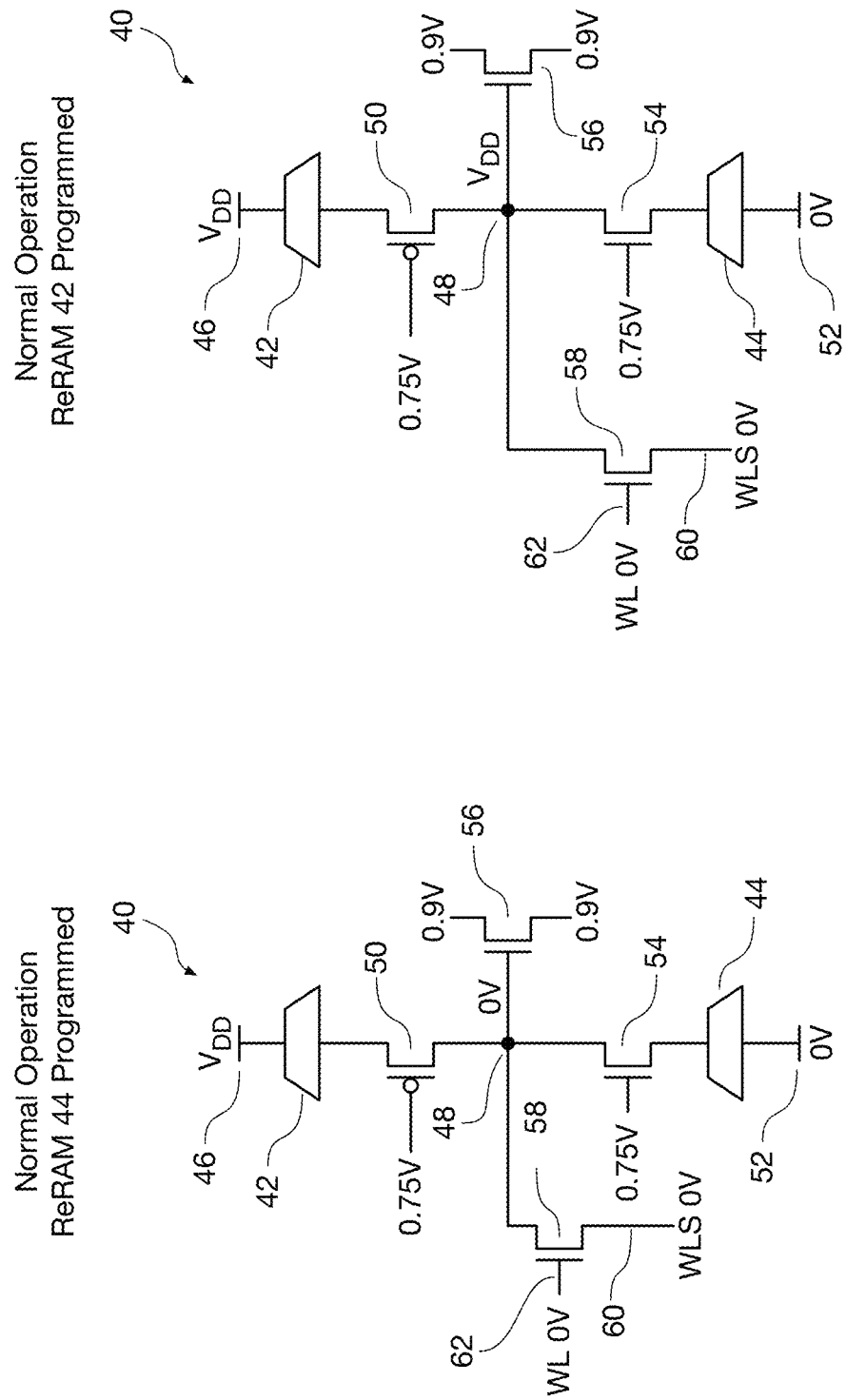

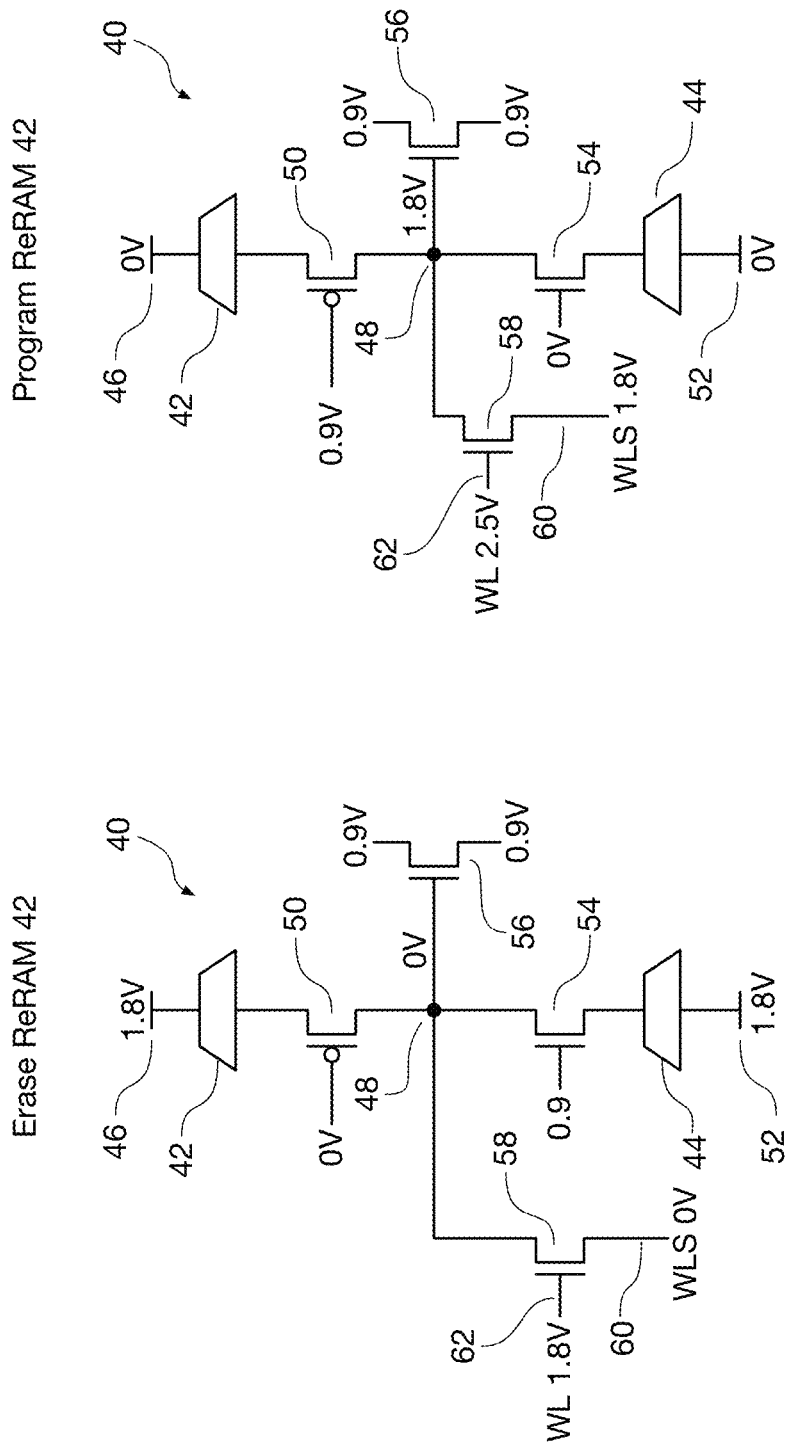

CIRCUITRY AND METHODS FOR PROGRAMMING RESISTIVE RANDOM ACCESS MEMORY DEVICES

BACKGROUND

The present invention relates to resistive random access memory (ReRAM) devices. More particularly, the present invention relates to circuitry and methods for programming ReRAM devices.

ReRAM cells program by diffusion of metal ions through an electrolyte layer that is otherwise a barrier to electron flow. During programming an electric field (e-field) is presented across the device by placing appropriate potentials on the bit lines and word lines to which the cell is connected. The e-field increases until it causes breakdown of the electrolyte as the metal filament diffuses through the electrolyte from the ion source side of the device and reaches the opposite electrode. This often results in damage to the electrolyte, which makes the device difficult to erase and may even lead to device failure. A reverse e-field is applied to erase the device. The ion source of each of the ReRAM cells, throughout this document, is illustrated by the wider end.

Attempts to control this programming process have been made in some designs by placing a current limiting device on the bit line to limit the avalanche current through the ReRAM device during the programming process. FIGS. 1A through 1D are schematic diagrams showing potentials applied to a prior-art ReRAM one-transistor one ReRAM device (1T1R) memory cell 10 during program, erase, and normal operating conditions and illustrate such a prior-art solution as applied to a one-transistor one ReRAM device (1T1R) memory cell 10 such as may be employed in a programmable read only memory (PROM). ReRAM cell 10 includes a single ReRAM device 12 in series with n-channel transistor 14 and p-channel transistor 16 between bitlines 18 and 20. The output of the ReRAM cell is at an output node indicated by a dot identified by reference numeral 22. As is well known in the art bitlines 18 and 20 and the gates of transistors 14 and 16 may be selectively coupled to appropriate voltage potentials for programming, erasing, and reading the memory cell 10.

A capacitor 24 depicted in dashed lines represents the capacitance of output node 22 which is shared by many ReRAM cells. Capacitor 24 is shown only in FIGS. 1A and 1B during programming and erasing where it can present a problem to the ReRAM device itself. During read operations, the node represented by capacitor 24 must charge or discharge to the bit value before the cell can be reliably read.

P-channel transistor 16 is common to all ReRAM cells on the output node 22 and acts as a current drive/limit transistor in programming and erasing modes of FIGS. 1A and 1B. One of any number of suitable sense amplifier circuits may be coupled to output node 22 to generate a signal representing the state of the ReRAM cell from the voltage of either 0V or 0.5V that are shown in FIGS. 1C and 1D, respectively.

As shown in FIG. 1A, ReRAM device 12 is programmed to its ON state, i.e. its low resistance state, by applying a voltage such as 3.3V to the gate of n-channel transistor 14 which serves as the access transistor to enable reading and writing of ReRAM device 12. The gate of n-channel transistor 14 is biased at, for example 3.3V, and p-channel transistor 16 has a voltage $V_{ref}$ of, for example 2.3V placed on its gate and acts as a current limiting device that supplies a current determined by the value of $V_{ref}$. Bitline 18 is biased at 3.3V and bitline 20 is biased at ground. Current controlled by p-channel transistor 16 drives through ReRAM 12 to achieve a low resistance state.

As shown in FIG. 1B, ReRAM device 12 is erased to its OFF state, i.e. its high resistance state, by applying 3.3 V to the bottom of ReRAM device 12 at bitline 20, and applying ground to the top terminal of P-channel transistor 16 at bitline 18. The gate of re-channel transistor 14 is biased at, for example 3.3V, and p-channel transistor 16 has a voltage $V_{ref}$ of, for example −1V placed on its gate. Current flows from bitline 20 towards bitline 18 until ReRAM device 12 exhibits a high resistance state, with n-channel transistor 14 having it source coupled to output node 22 and p-channel transistor having its drain coupled to output node 22.

After programming ReRAM device 12, during an operating mode of the 1T1R ReRAM memory cell 10, the ReRAM cell 10 is biased as shown in FIGS. 1C and 1D, with an operating voltage of, for example, 0.5V applied to bitline 18 and ground applied to bitline 20. N-channel transistor 14 is biased to be completely turned on so that in the event that ReRAM device 12 is in its ON state (FIG. 1C) ground potential appears at output node 22 and p-channel transistor 16 is biased at, for example 0V, to be turned on, so that in the event that ReRAM device is in its OFF state (FIG. 1D) output node 22 will be pulled up by p-channel transistor 16 as will be explained further below in relation to FIG. 1D. Persons of ordinary skill in the art will appreciate that the bitline capacitance 24 is not a consideration where the ReRAM cell is used as a programming element in a user-configurable circuit such as an FPGA where the memory remains in a fixed state and delay time in charging the output node for a read operation is not a consideration. With this in mind, capacitor 24 is not shown in FIGS. 1C and 1D. The operating voltage of 0.5V is chosen to minimize the stress across ReRAM device 12 in its erased (OFF) state.

This prior-art arrangement is inadequate when programming the ReRAM device as it ignores the current dump resulting from the capacitance (in dashed lines) of the output node 22. If the ReRAM device 12 is in a high resistance state, i.e. is in an erased state, its resistance is about 1 Mohm. When an applied programming voltage causes it to change to its low resistance state (e.g., 10K ohms) there will be a large current spike associated with the discharge of the capacitor 24. This large current spike can damage the structure of the ReRAM device 12.

FIG. 2 is a graph showing the voltage/current curve for a typical ReRAM device 12 during programming. The x-axis represents time from when a programming voltage is applied to change the state of ReRAM device 12 to its "low resistance" state. The left y-axis represents voltage across the ReRAM device 12 and the right y-axis represents current through the ReRAM device 12. The solid trace 26 represents voltage across the device in accordance with the prior art.

FIG. 3 is a graph that plots the power dissipated (reference numeral 28) across the ReRAM device 12 as a function of time, in accordance with the prior art, where the x-axis represents time from when the programming voltage is applied to change the state of ReRAM device 12 to its "low resistance" state, and the y-axis represents power dissipation across the ReRAM device 12. The programming voltage is initially applied at time 0. Until just prior to time 2E-08, when the capacitance 24 of the output node 22 is sufficiently discharged, a maximum amount of power, limited by the current limiting p-channel transistor 16 is dissipated. This level of power may be enough to cause damage to the ReRAM device. In the simulation shown in FIGS. 2 and 3 the voltage is applied at time zero and the filament is formed in a fraction of a nanosecond causing the current to rise to the maximum current-limited level resulting in the maximum power dissipation above that which is desired and which may be high enough to damage to the ReRAM device.

BRIEF DESCRIPTION

According to one aspect of the present invention, a ReRAM device is positioned in the drain circuit of a current limiting device, such that when the voltage across the ReRAM device drops rapidly during the programming process, the current will not increase significantly. For example, the n-channel access transistor/programming transistor may have its source connected to a lower power rail so that the bias on the gate will cause it to be a current limiting device, thereby limiting the capacitive dump spike current. In particular, the access transistor is connected and biased so as to act as a current limiter. In the prior art only the p-channel transistor is biased as a current limiter.

According to another aspect of the present invention, the application of programming voltage is spit into at least two pulses. Each additional pulse is accompanied by an increase in gate bias to increase the current drive such that the metal filament forming in the ReRAM device increases in size in a controlled manner. In particular, a first pulse is designed so as not allow enough current to cause any damage to the device, but be sufficient to allow an initial filament to form. This pulse is formed by control of the gate voltage to the access transistor. One or more additional pulses are generated using gate voltages that allow for the passage of larger values of current, sufficient to drive the device to the low-resistance state.

According to another aspect of the present invention, a variable ramp bias is applied to the bit line such that the e-field applied across the ReRAM device is minimized initially as the filament is forming and is increased after the ReRAM device begins to conduct current. Thus, the bias voltage is increased in concert with each successive current pulse.

According to another aspect of the present invention, all three aforementioned aspects of the present invention, or any combination of them may be employed to limit damage to the solid electrolyte layer of the ReRAM device.

BRIEF DESCRIPTION OF THE DRAWING FIGURES

The invention will be explained in more detail in the following with reference to embodiments and to the drawing in which are shown:

FIG. 1A is a schematic diagram showing a prior-art memory cell including a single ReRAM device and potentials applied to program the ReRAM device to its ON state;

FIG. 1B is a schematic diagram showing the prior-art memory cell of FIG. 1A and potentials applied to erase the ReRAM device to its OFF state;

FIG. 1C is a schematic diagram showing the prior-art memory cell of FIG. 1A in its ON state and potentials applied to read the ReRAM device;

FIG. 1D is a schematic diagram showing the prior-art memory cell of FIG. 1A in its OFF state and potentials applied to read the ReRAM device;

FIG. 4A is a schematic diagram showing a circuit arrangement for a 1T1R ReRAM cell including a single ReRAM device in accordance with one aspect of the present invention and potentials applied to program the ReRAM device to its ON state;

FIG. 4B is a schematic diagram showing the memory cell of FIG. 4A and potentials applied to erase the ReRAM device to its OFF state;

FIG. 4C is a schematic diagram showing the memory cell of FIG. 4A with the ReRAM cell in its ON state and potentials applied to read the memory cell;

FIG. 4D is a schematic diagram showing the memory cell of FIG. 4A with the ReRAM cell in its OFF state and potentials applied to read the memory cell;

FIG. 5 is a schematic diagram of a push-pull ReRAM cell including two ReRAM devices illustrating circuit conditions present during normal (read) operation where the lower ReRAM device is programmed and the upper ReRAM device is erased;

FIG. 6 is a schematic diagram of a push-pull ReRAM cell including two ReRAM devices illustrating circuit conditions present during normal (read) operation where the lower ReRAM device is erased and the upper ReRAM device is programmed;

FIG. 7 is a schematic diagram of a push-pull ReRAM cell including two ReRAM devices illustrating circuit conditions for erasing the upper ReRAM device to be in its off state in accordance with an aspect of the present invention;

FIG. 8 is a schematic diagram of a push-pull ReRAM cell including two ReRAM devices illustrating circuit conditions for programming the upper ReRAM device to be in its on state in accordance with an aspect of the present invention;

Figure 13A:
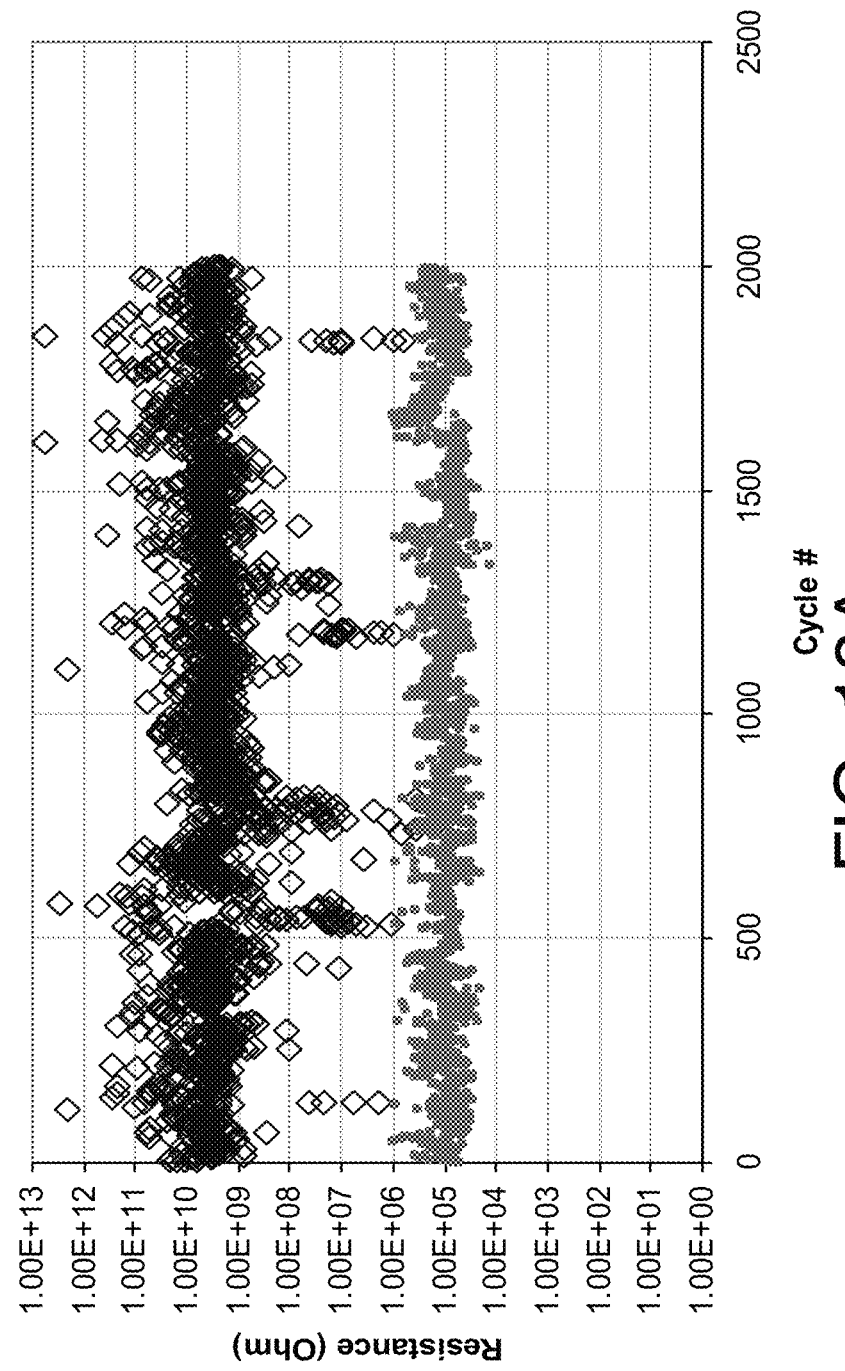
Figure 13B:
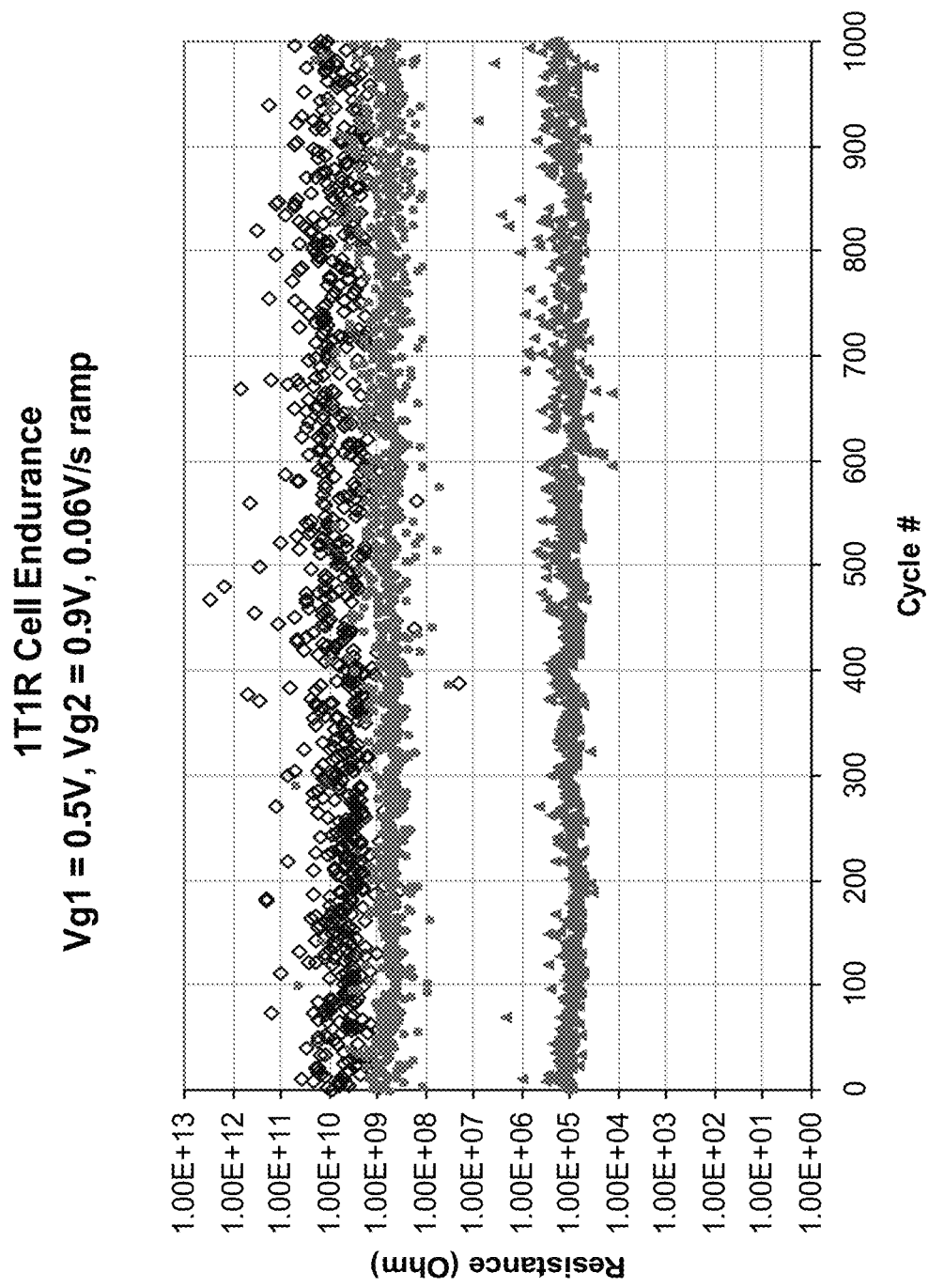

FIG. 13A is a plot showing the distribution of on and off resistances of ReRAM cells over a 2,000-cycle endurance test when the cells are programmed in accordance with prior-art techniques; and FIG. 13B is a plot showing the distribution of on and off resistances of ReRAM cells over a 2,000-cycle endurance test when the cells are programmed in accordance with the principles of the present invention.

DETAILED DESCRIPTION

Persons of ordinary skill in the art will realize that the following description of the present invention is illustrative only and not in any way limiting. Other embodiments of the invention will readily suggest themselves to such skilled persons.

Referring now to FIGS. 4A through 4D, a 1T1R ReRAM memory cell 30 is depicted with various potentials applied to program, erase, and read the memory cell. Like ReRAM memory cell 10 of FIGS. 1A through 1D, ReRAM memory cell 30 includes ReRAM device 12, n-channel access transistor 14 and p-channel sense transistor 16 connected between bitlines 18 and 20. P-channel sense transistor 16 is connected between ReRAM device 12 and bitline 18, however n-channel access transistor 14 is advantageously connected between ReRAM device 12 and bitline 20. As is well known in the art bitlines 18 and 20 and the gates of transistors 14 and 16 may be selectively coupled to appropriate voltage potentials for programming, erasing, and reading the memory cell 30.

FIG. 4A shows potentials applied to program the ReRAM device to its ON state. P-channel transistor 16 is turned on because its source is at 3.3V and its gate is at 0V. Output node 22 is thus at 3.3V. N-channel transistor 14 is weakly turned on because its gate is at 0.9V and its source is at 0V. Under these conditions, the ReRAM device 12 has the entire 3.3V across it with a polarity to cause ions to migrate from the ion source into the solid electrolyte layer. Because the source of n-channel transistor 14 is at the fixed ground potential, and its gate voltage is at a fixed potential, $V_{GS}$ of n-channel transistor 14 is also fixed and the gate voltage of n-channel transistor 14 can be selected to allow re-channel transistor 24 to be placed in saturation and therefore be an effective current limiting device.

FIG. 4B shows potentials applied to erase the ReRAM device to its OFF state. P-channel transistor 16 is turned on because its source is at 0V and its gate is at −1V. Output node 22, coupled to the drain of p-channel transistor 16 is thus at 0V. N-channel transistor 14 is turned on because its drain, i.e. terminal connected to bitline 20, is at 3.3V, its gate is at 3.3V and its upper terminal, i.e. the terminal connected to output node 22 through ON state ReRAM 12 acting as the source, is at the lowest voltage of 0V. Its gate-to-source voltage is therefore greater than the $V_t$ of the transistor (0.5V) so the source will supply 3.3V-$V_t$ and up to 2.8V will appear across the ReRAM device 12 with a polarity to cause ions to migrate from the conductive bridge in the solid electrolyte layer back to the ion source, represented by the wider end of ReRAM device 12.

FIG. 4C shows the memory cell of FIG. 14A with the ReRAM cell in its ON state and potentials applied to read the memory cell. N-channel transistor 14 is turned on because its gate-to-source voltage is 3.3V and output node 22 is pulled down to ground through the low resistance on-state ReRAM device 12. P-channel transistor 16 acts as a current source, limiting the current through ReRAM device 12 since p-channel transistor 16 is held weakly on by the gate bias being only 0.5 V below bitline 18, the terminal coupled to bitline 18 acting as the source of p-channel transistor 16.

FIG. 4D shows the memory cell of FIG. 4A with the ReRAM cell in its OFF state and potentials applied to read the memory cell. N-channel transistor 14 is turned on because its gate-to-source voltage is 3.3V. P-channel transistor 16 is turned weakly on because its gate-to-source voltage is 0.5V. The high resistance of off-state ReRAM device 12 allows output node 22 to be pulled up by p-channel transistor 16 despite being only weakly on.

In the embodiment depicted in FIGS. 4A through 4D, the n-channel access transistor 14 has the ReRAM device 12 in its drain circuit and acts as a current limiting device due to particularly selected bias such that when the voltage across the ReRAM device collapses, the current will not increase significantly. The access transistor/programming transistor 14 is shown in FIG. 4A having its source connected to a power rail (ground) on bitline 20 so the bias on its gate, selected to be near the threshold voltage of n-channel transistor 14, will cause it to be a current limiting device, thereby limiting the capacitive dump spike current. In the prior art circuit depicted in FIGS. 1A through 1D, only p-channel transistor 16 is biased as a current limiter.

Figure 2:
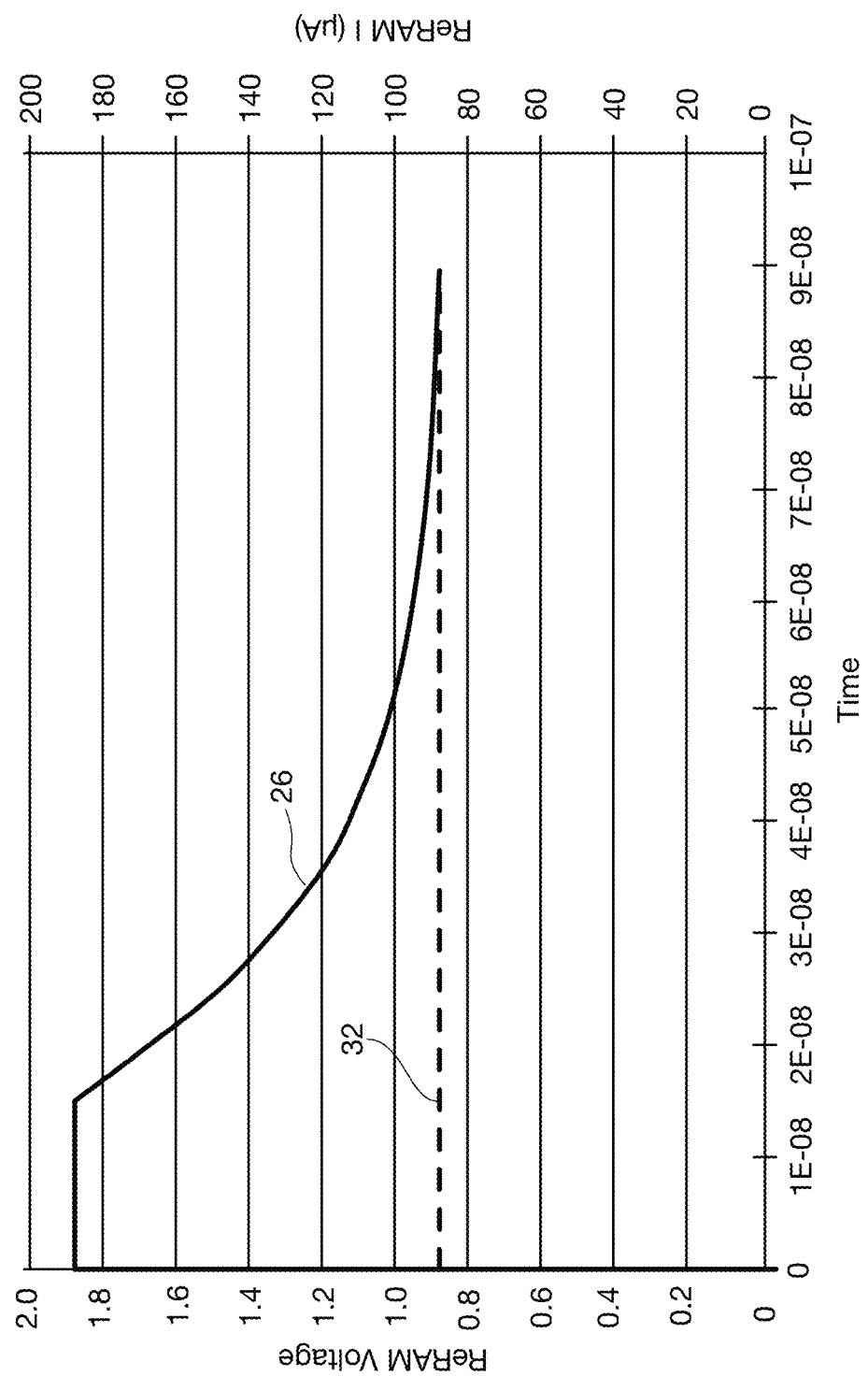
FIG. 2 is a graph showing in a solid trace voltage and current across a ReRAM cell during a prior-art programming cycle as a function of time and in a dashed-line trace voltage and current across a ReRAM cell during a programming cycle in accordance with the present invention.
Figure 3:
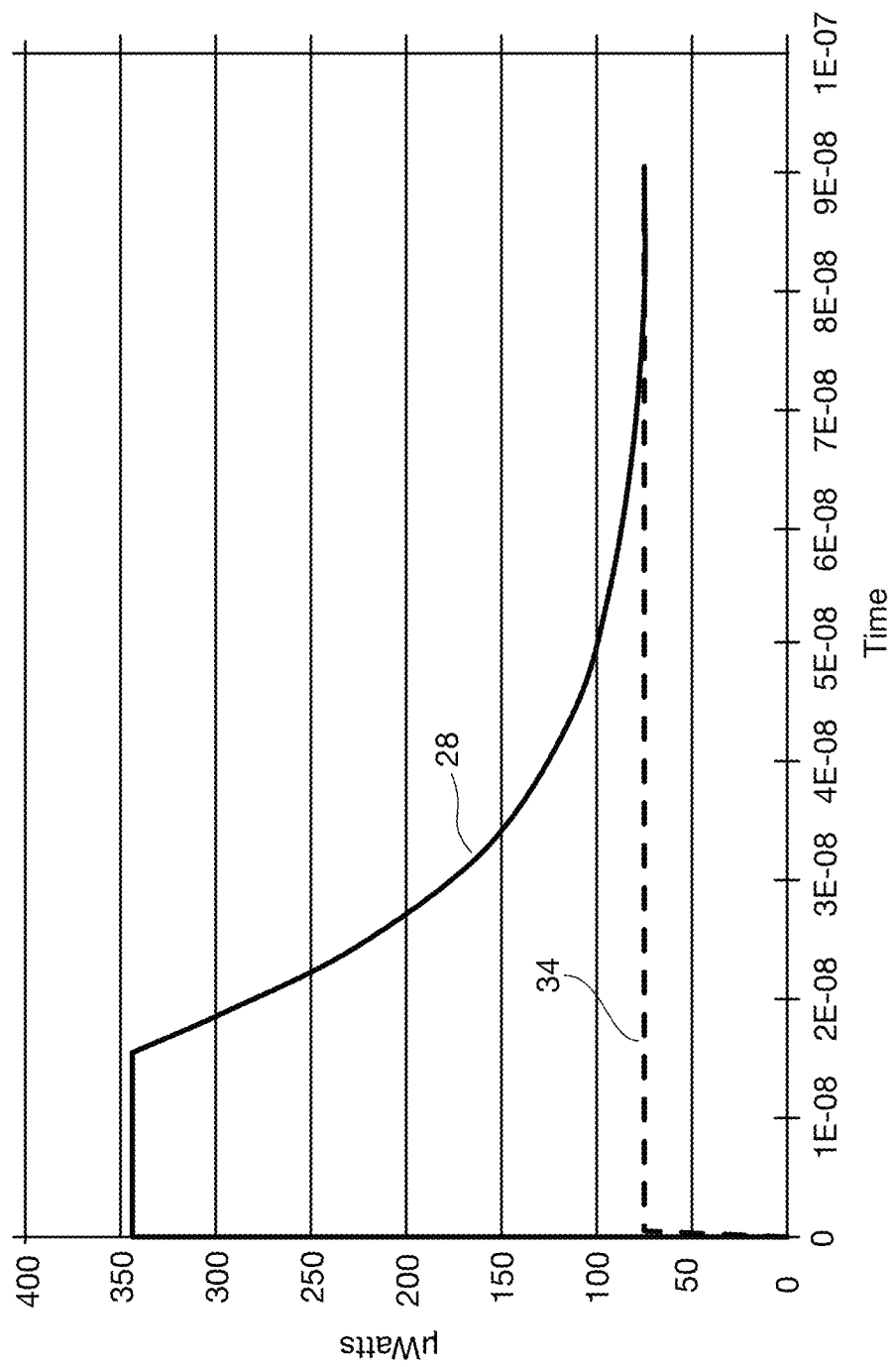
FIG. 3 is a graph showing in a solid trace power dissipated in a ReRAM cell during a prior-art programming cycle as a function of time and in a dashed-line trace power dissipated in a ReRAM cell during a programming cycle in accordance with the present invention.

The effect of employing the circuit arrangement shown in FIGS. 4A through 4D is shown in FIGS. 2 and 3. Dashed line trace 32 represents the V/I curve during programming of the ReRAM cell 30 of FIGS. 4A through 4D. Because access transistor 14 is employed as a current limiting device whose source is at a fixed voltage (common source configuration), the curve of dashed line 32 maintains a constant value during the entire programming cycle because the gate-to-source voltage of access transistor 14 is constant, as opposed to the gate-to-source voltage of access transistor 14 in FIG. 1A, which varies with the resistance of the ReRAM as it is being programmed. Similarly, dashed line trace 34 in FIG. 3 represents the power dissipated in ReRAM device 12 during programming of the ReRAM cell 30 as shown in FIG. 4A. Because access transistor 14 is employed as a current limiting device whose source is at a fixed voltage and whose gate-to-source voltage is thus constant, the power is maintained at a constant value during the entire programming cycle.

The ReRAM cells 10 and 30 of FIGS. 1A through 1D and FIGS. 4A through 4D are known as 1T1R cells. As previously noted, the 1T1R cell is the basic building block of a NVRRAM (PROM) array as the access transistor 14 is used to address the cell thereby avoiding sneak path problems to ensure reliable operation. The 1T1R structure is more compact and may enable vertically stacking memory layers, ideally suited for mass storage devices. As noted above, the relative positioning of the access transistor 14 and ReRAM device of FIG. 4 avoids power spikes during programming of the ReRAM device 12.

Figure 10:
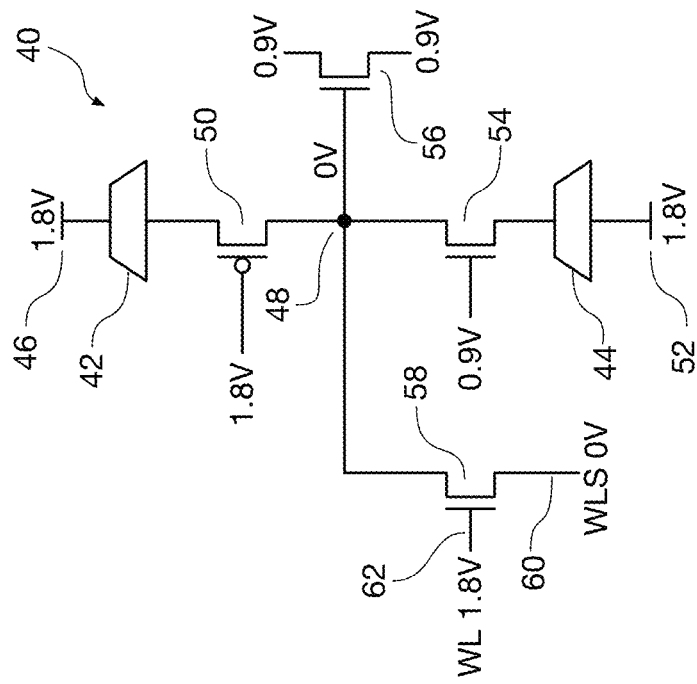
FIG. 10 is a schematic diagram of a push-pull ReRAM cell including two ReRAM devices illustrating circuit conditions for programming the lower ReRAM device to be in its on state in accordance with an aspect of the present invention
Figure 9:
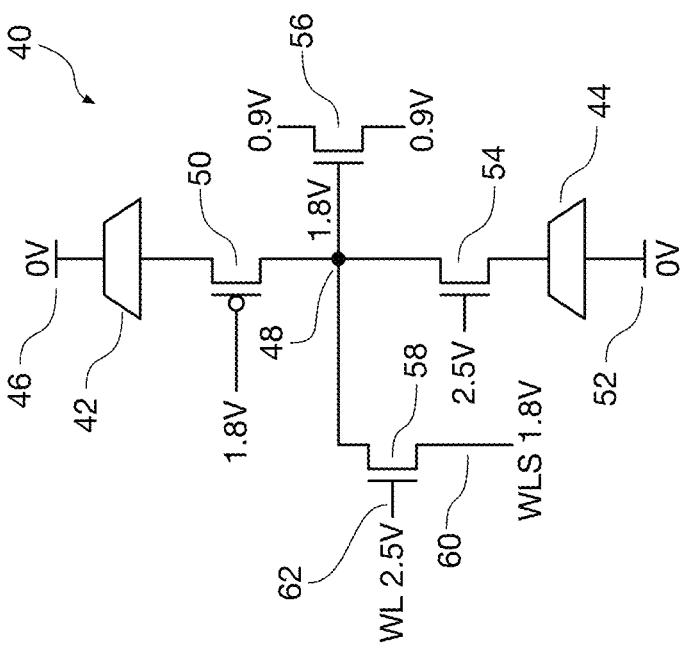
FIG. 9 is a schematic diagram of a push-pull ReRAM cell including two ReRAM devices illustrating circuit conditions for erasing the lower ReRAM device to be in its off state in accordance with an aspect of the present invention.

Referring now to FIGS. 5 through 10 schematic drawings depict a push-pull ReRAM memory cell, such as the one shown in as shown in FIG. 5 of co-pending U.S. patent application Ser. No. 15/375,014, filed Dec. 9, 2016 during, respectively, normal operation (read) with lower ReRAM device 44 programmed (FIG. 5), with lower ReRAM device 44 programmed (FIG. 6), erasing and programming the upper one of the push-pull ReRAM devices 42 (FIGS. 7 and 8, respectively), and erasing and programming the lower one of the push-pull ReRAM devices 44 (FIGS. 9 and 10, respectively). Persons of ordinary skill in the art will appreciate that the voltage potentials shown and described with reference to FIGS. 5 through 10 are illustrative only and such skilled persons will be readily able to choose programming potentials appropriate for the particular devices with which they are working. Bitlines 46 and 52, the gates of transistors 50 and 54, and the WLS line 60 and WL line 62 may be selectively coupled to appropriate voltage potentials for programming, erasing, and reading the memory cell 10.

Circuitry for selectively providing appropriate potentials to circuit nodes for programming, erasing, and operating memory cells is well known in the art.

ReRAM cell 40 includes an upper ReRAM device 42 and a lower ReRAM device 44. Upper ReRAM device 42 is connected between a top node 46 (a first bit line) and an output node 48 through p-channel access transistor 50 and lower ReRAM device 44 is connected between a bottom node 52 (a second bit line) and the output node 48 through n-channel access transistor 54. ReRAM cell 40 may be used as a configuration cell for a user-programmable integrated circuit such as an FPGA integrated circuit. When ReRAM cell 40 is so used, the output node 48 is shown connected to the gate of one or more switch transistors 56. Switch transistors 56 may be used to make connections and define logic module functions in a user-programmable integrated circuit such as a field-programmable-gate-array (FPGA) integrated circuit. During normal circuit operation (when the ReRAM cell 40 is controlling switch transistor 56 by selectively turning it on or off) as depicted in FIGS. 5 and 6, the top node 46 will be biased at $V_{DD}$ and the bottom node 52 will be biased at a lower potential such as ground. An n-channel programming transistor 58 is connected between a programming voltage line 60, denoted WLS (word line source), and output node 48. The gate of n-channel programming transistor 58 is connected to a word line 62, denoted WL. N-channel programming transistor 58 is turned off during normal (read) circuit operation by biasing its gate at 0V and WLS at 0V.

During normal circuit operation, one of ReRAM devices 42 and 44 will be in its on state and the other one of ReRAM devices 42 and 44 will be in its off state. Depending on which ReRAM device is on and which ReRAM device is off, node 48 will either be pulled up to the voltage at node 46 ($V_{DD}$) to turn on switch transistor 56 or down to the voltage at node 52 (0V) to turn off switch transistor 56. FIG. 5 shows the condition where lower ReRAM device 44 has been programmed to turn it on and upper ReRAM device 42 has been erased to turn it off, pulling output node 48 down to 0V. FIG. 6 shows the condition where lower ReRAM device 44 has been erased to turn it off and upper ReRAM device 42 has been programmed to turn it on, pulling output node 48 up to $V_{DD}$.

Because the ReRAM device that is in its on state will have almost no voltage across it, essentially the entire $V_{DD}$ voltage will be dropped across the series combination of the one of ReRAM devices 42 and 44 that is in its off state and its access transistor 50 or 54, respectively. The voltages applied respectively to the gates of p-channel access transistor 50 and n-channel access transistor 54 are selected such that $V_{DD}$ potential will be divided such that only about 0.2-0.5V will be maintained across the off-state ReRAM cell, the remainder of the voltage being dropped across its access transistor 50 or 54 to prevent overstressing the off-state ReRAM device. Assuming a $V_{DD}$ voltage of 1.5V, the gate voltage for a p-channel access transistor 50 having a $V_t$ of −0.3V would be 0.75V, resulting in about 1.3V across the p-channel access transistor 50 and about 0.2V across off-state ReRAM device 42.

Similar conditions apply to an off-state ReRAM device 44 in series with the re-channel access transistor 54 as shown in FIG. 6. Assuming a $V_{DD}$ voltage of 1.5V, the gate voltage for n-channel access transistor 54 having a $V_t$ of 0.3V would be about 0.75V, resulting in about 1.05V across the n-channel access transistor 54 and about 0.45V across off-state ReRAM device 44. This biasing scheme avoids overstressing the off-state ReRAM device 44.

The ReRAM device 42, 44 that is in its on state has very little voltage across it and ReRAM device stress is not an issue. As an example, if ReRAM device 44 is in its low-resistance on state, and n-channel access transistor 44 has a $V_t$ of 0.3V, and with a gate voltage of 0.75V, then n-channel transistor 54 is turned on and passes the 0V bias of node 52 to node 48. There is insignificant voltage drop as the current through the off-state ReRAM 42 is several orders of magnitude lower than can be sourced by the on-state ReRAM 44.

Before programming the ReRAM cell 40, preferably both ReRAM devices 42 and 44 are erased (turned off) to their high resistance states. Then, only one of the ReRAM devices 42 and 44 is programmed to its low resistance (on) state.

FIGS. 7 and 8, respectively, show the voltages applied to ReRAM cell 40 to erase (turn off) the upper ReRAM device 42 and the voltages applied to ReRAM cell 40 to program (turn on) the upper ReRAM device 42. Programming the upper ReRAM device 42 and leaving the lower ReRAM device 44 in an erased (turned off) state turns on the switch transistors 56 during normal operation by pulling the output node 48 up to $V_{DD}$ during normal circuit operation.

FIG. 7 shows the voltages applied to ReRAM cell 40 to erase (turn off) the upper ReRAM device 42. Bitlines 46 and 52 are biased at 1.8V. WLS at reference numeral 60 is biased at 0V and programming transistor 58 is turned on by applying a potential (e.g, 1.8V) to its gate from word line WL 62 and places a potential of, for example, 0V at output node 48. The lines WLS 60 and WL 62 may be decoded and connected to programming transistors 58 in a group (such as a row or segment of a row) of memory cells 40. Persons of ordinary skill in the semiconductor memory art will recognize the memory word line function performed by WLs and WL lines 60 and 62.

The terminal of p-channel transistor 50 connected to the bitline 46 through the upper ReRAM device 42, and upper ReRAM device 42 becomes the source of p-channel transistor 50 because it is at a higher potential than the other terminal (connected to 0V at the output node 48) and is thus turned on because its gate-to-source voltage is −1.8V. This causes current to flow through the upper ReRAM device 42 in a direction that causes the metal ions forming the conductive bridge to migrate through the solid electrolyte back towards the ion source to eliminate the conductive bridge. The gate of n-channel transistor 54 is biased at, for example, 0V. The terminal of n-channel transistor 54 connected to output node 48 becomes the source of n-channel transistor 54 because it is at a lower potential than the other terminal (connected to 1.8V at bitline 52 through the lower ReRAM device 44) and n-channel transistor 54 is thus turned off because its gate-to-source voltage is 0V. The current flow through ReRAM device 42 thus flows through programming transistor 58.

FIG. 8 shows the voltages applied to ReRAM cell 40 to program (turn on) the upper ReRAM device 42 and leave the lower ReRAM device 44 in an erased (turned off) state. Programming the upper ReRAM device 42 and leaving the lower ReRAM device 44 in an erased (turned off) state turns on the switch transistors 56 by pulling the output node 48 up to $V_{DD}$ during normal circuit operation. The upper ReRAM device 42 is programmed by biasing top node 46 at a voltage such as 0V, biasing the source of re-channel programming transistor 58 at a voltage such as 1.8V impressed on WLS and biasing the gate of n-channel programming transistor 58 from WL 62 to turn it on, such as by applying a bias of 2.5V, and thus place 1.8V on the output node 48. Persons of ordinary skill in the art will observe that, under these conditions, the terminal of p-channel access transistor 50 connected to output node 48 becomes its source and the terminal of p-channel access transistor 50 connected to upper ReRAM device 42 becomes its drain since it is at a lower voltage potential. Under these conditions p-channel access transistor 50 acts as a common source current limiting device, whose current level is set by the value of $V_{GS}$ of p-channel access transistor 50. The gate of the p-channel access transistor 50 is set to a voltage that is lower than that of its source (e.g., 0.9V in this example) to turn it on and control the amount of programming current flowing through the ReRAM device 42. The actual voltage applied to the gate of the p-channel access transistor 50 in any particular circuit design will be determined by the $V_t$ of p-channel access transistor 50 as well as the amount of current that is desired to flow through upper ReRAM device 42. The device geometry and characteristics of the ReRAM device being programmed will also affect the amount of programming current desired and thus the choice of the gate voltage. The polarity of the voltage across upper ReRAM device 42 causes ions from the metal electrode to migrate into the solid electrolyte layer of the ReRAM device 42, forming a bridging connection to place it in its low resistance state to turn it on. As noted above, p-channel access transistor 50 is acting as a current limiting device to limit the programming current and power dissipation in upper ReRAM device 42 during programming in accordance with the present invention.

Because the bottom node 52 is also biased at 0V, the potential across lower ReRAM device 44 is such as to prevent migration of metal ions from the metal electrode into its solid electrolyte layer and it remains in an erased state. Lower ReRAM device 44 will not be programmed regardless of the bias applied to n-channel access transistor 54 during programming, which, as a non-limiting example, could be either 0V or 1.8V, or any voltage in between those values to lower the stress on the device not being programmed.

FIGS. 9 and 10, respectively, show the voltages applied to ReRAM cell 40 to erase (turn off) the lower ReRAM device 44 and the voltages applied to ReRAM cell 40 to program (turn on) the lower ReRAM device 44. Programming the lower ReRAM device 44 and leaving the upper ReRAM device 42 in an erased (turned off) state turns off the switch transistors 56 during normal operation by pulling the output node 48 down to ground during normal circuit operation.

FIG. 9 shows the voltages applied to ReRAM cell 40 to erase (turn off) the lower ReRAM device 44. Bitlines 46 and 52 are biased at 0V. Programming transistor 58 is turned on and places a potential of, for example, 1.8V at output node 48. The terminal of p-channel transistor 50 connected to the output node 48 becomes the source of p-channel transistor 50 because it is at a higher potential than the other terminal (connected to 0V through upper ReRAM device 42) and is thus turned off because its gate-to-source voltage is zero. The terminal of n-channel transistor 54 connected to bitline 52 through the lower ReRAM device 44 becomes the source of n-channel transistor 54 because it is at a lower potential than the other terminal (connected to 0V through upper ReRAM device 42) and is thus turned on because its gate-to-source voltage is 1.8V. This causes current to flow through the lower ReRAM device 44 in a direction that causes the metal ions forming the conductive bridge to migrate through the solid electrolyte back towards the ion source to eliminate the conductive bridge.

Referring now to FIG. 10, the lower ReRAM device 44 is programmed by biasing both top node 46 and bottom node 52 at a voltage such as 1.8V, biasing the source of re-channel programming transistor 58 at 0V and biasing the gate of n-channel programming transistor 58 from word line 62 at a voltage to turn it on and place 0V on the output node 48. Persons of ordinary skill in the art will appreciate that the voltage applied to node WL bias will depend on the $V_t$ of programming transistor 58, and in an exemplary embodiment may be between about 0.5V or 1V. Since the $V_t$ of programming transistor 58 is usually between about 0.2V and about 0.3V, this biasing assures that there will be no voltage drop across programming transistor 58. The source and drain terminals of the switch transistor 56 are placed at a voltage that is low enough to prevent breakdown of the gate of the switch transistor 56 due to overvoltage. Where the programming potential is about 1.8V, biasing the source and drain terminals of the switch transistor at about 0.9V during programming protects the switch transistor gate regardless of whether the upper ReRAM device 42 or the lower ReRAM device 44 is being programmed.

Persons of ordinary skill in the art will observe that, under these conditions, the terminal of n-channel access transistor 54 connected to output node 48 becomes its source and the terminal of n-channel access transistor 54 connected to lower ReRAM device 44 becomes its drain since it is at a higher voltage potential. The polarity of the voltage across lower ReRAM device 44 causes ions from the metal electrode to migrate into the solid electrolyte layer of the ReRAM device 44, forming a bridging connection to place it in its low resistance state to turn it on. As noted above, n-channel access transistor 54 is acting as a common-source current limiting device, responsive to the selected gate voltage, to limit the programming current and power dissipation in lower ReRAM device 44 during programming in accordance with the present invention. The actual voltage applied to the gate of the n-channel access transistor 54 in any particular circuit design will be determined by the $V_t$ of n-channel access transistor 54 as well as the amount of current that is desired to flow through lower ReRAM device 44. The device geometry and characteristics of the ReRAM device being programmed will also affect the amount of programming current desired and thus the choice of the gate voltage. Persons of ordinary skill in the art will observe that because the top node 46 is also biased at 1.8V, the potential across upper ReRAM device 42 is the opposite of the polarity of the voltage across lower ReRAM device 44, such as to prevent migration of metal ions from the metal electrode into its solid electrolyte layer to form a bridging connection to place it in its low resistance state and it remains in an erased state. Upper ReRAM device will not be programmed regardless of the bias applied to the gate of p-channel access transistor 50 during programming, which, as a non-limiting example, could be either 0V or 1.8V.

Figure 11A:
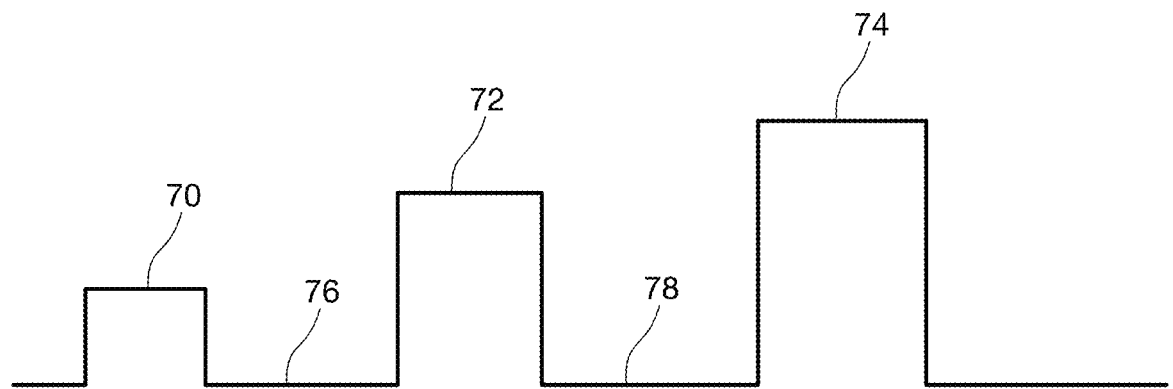
FIG. 11A is a trace showing illustrative successively increasing programming current pulses in accordance with one aspect of the present invention.

According to another aspect of the present invention illustrated in FIG. 11A, successively increasing programming current pulses are used to program the ReRAM devices. FIG. 11A shows three programming current pulses 70, 72, and 74. Pulses 70 and 72 are separated by an interval 76 and pulses 72 and 74 are separated by an interval 78. Successively increasing the amplitude of the current pulses is accomplished by increasing the voltage bias applied to the gate of the access transistor 14 of FIG. 4 or by controlling the gate voltage supplied to the one of the p-channel access transistor 50 and n-channel access transistor 54 of FIG. 8 and FIG. 10 associated with the one of ReRAM devices 42 and 44 that is being programmed. The first pulse is set to an initial value. Each additional pulse is generated using an increased gate bias voltage to increase the current drive such that the metal filament through the solid electrolyte layer of the ReRAM device increases in size in a controlled manner. In particular, the first pulse is selected so as not allow enough current to cause any damage to the device, but to be sufficient to allow an initial filament to form. For example, a first pulse 70 may be followed by a second pulse 72 and a third pulse 74. As will be appreciated by persons of ordinary skill in the art, the pulse widths and amplitudes to be selected for any given ReRAM device will depend on the number of pulses to be employed, the device geometry and characteristics of the ReRAM device being programmed, including the thickness and composition of the solid electrolyte as well as the composition of the metal layer ion source that will be used to form the conductive filament through the solid electrolyte. Such skilled persons will appreciate that these selections will be routine, as they are a normal component of performing the device characterizations of the ReRAM devices. The resistance of the ReRAM device being programmed may be measured during interpulse intervals 76 and/or 78 to determine how thoroughly the ReRAM has been programmed. Once the target resistance has been reached the programming pulses are terminated.

According to one exemplary non-limiting embodiment in which two pulses are employed, a typical first current pulse could be about 10 μA, followed by a second current pulse of about 100 μA. The larger current second pulse is preferably sufficient to drive the device to its low resistance state.

In other embodiments, a larger number of pulses could be employed. According to another exemplary non-limiting embodiment, three or more pulses could be employed, e.g., and as shown in FIG. 11A, a typical first current pulse could be about 10 μA, followed by a second current pulse of about 50 μA, a third current pulse of about 80 μA, and optionally a fourth current pulse of about 100 μA. Again, the particular implementation of this procedure according to the present invention will depend on the number of pulses to be employed, the device geometry and characteristics of the ReRAM device being programmed, including the thickness and composition of the solid electrolyte as well as the composition of the metal layer ion source that will be used to form the conductive filament through the solid electrolyte. Such skilled persons will appreciate that the selections of numbers of pulses and current amplitudes of the pulses will be routine, and can be incorporated into the performance of the device characterizations of the actual ReRAM devices used.

Figure 11B:
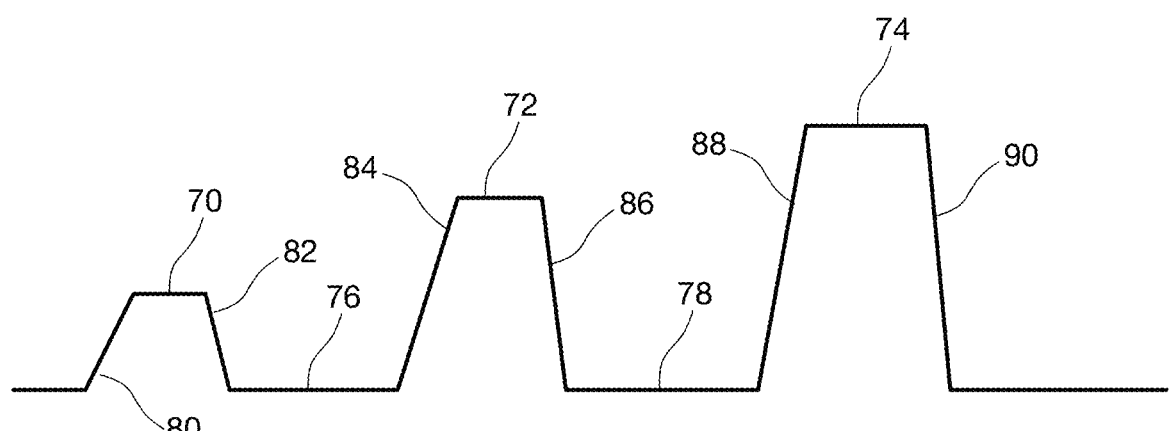
FIG. 11B is a trace showing illustrative successively increasing programming voltage pulses applied to a WLS line in accordance with another aspect of the present invention.

According to another aspect of the present invention illustrated in FIG. 11B, the leading and trailing edges of individual programming voltage pulses applied to bitline 20 of FIG. 4B or the WLS line of FIGS. 8 and 10 are ramped to successively higher levels in synchronization with the successively increasing voltage bias applied to the gate of the access transistor 14 of FIG. 4 or to the gate of the one of the p-channel access transistor 50 and n-channel access transistor 54 of FIG. 8 and FIG. 10 associated with the one of ReRAM devices 42 and 44 that is being programmed. Thus, pulse 70 includes a ramped leading-edge period 80 and a ramped trailing edge period 82. Similarly, pulse 72 includes a ramped leading-edge period 84 and a ramped trailing edge period 86 and pulse 74 includes a ramped leading edge period 88 and a ramped trailing edge period 90. The leading-edge ramp periods have a lesser slope than the trailing edge ramp periods.

Figure 11C:
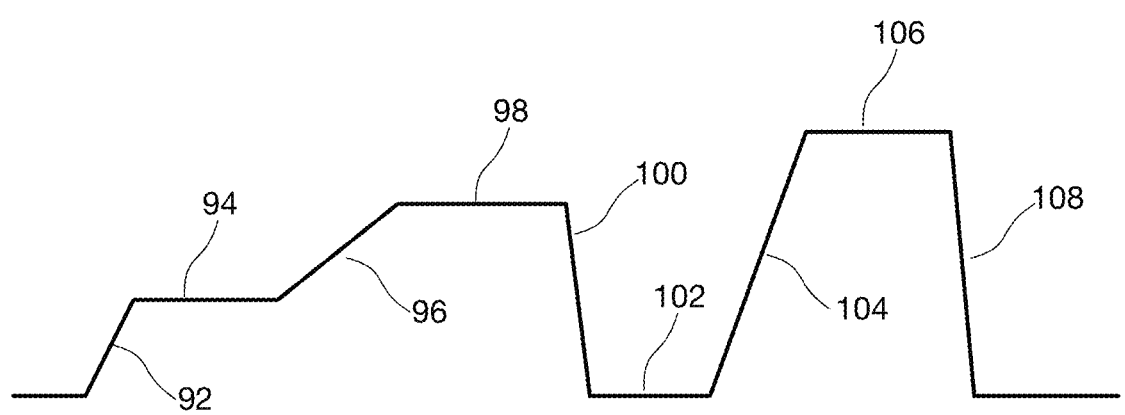
FIG. 11C is a trace showing illustrative programming voltage pulses applied to a WLS line in accordance with another aspect of the present invention.

According to another aspect of the present invention illustrated in FIG. 11C, the voltage bias applied to the WLS line 60 is a variable ramp voltage bias such that the initial e-field is minimized and increased after the device begins to conduct current. As illustrated in FIG. 11C, programming voltage is ramped up during a first leading-edge ramp period 92 to a first voltage value at reference numeral 94, followed by a second leading edge ramp-up period 96 to a second voltage value at reference numeral 98. Unlike the embodiments shown in FIGS. 11A and 11B, the voltage pulse does not return to zero and there is no interpulse interval. The second voltage value at reference numeral 98 is followed by a trailing edge ramp-down period 100 during which the voltage falls to zero. During an interpulse interval 102 the resistance of the ReRAM device being programmed may be measured. A second voltage pulse is then applied having a leading-edge ramp-up period 104 to a third higher voltage value at reference numeral 106, followed by a trailing edge ramp-down period 108 during which the voltage falls to zero.

By way of illustration, the first ramp period 80 may have a duration of between about 100 nS and about 10 μS to a current value of about 10 μA. The second ramp period 96 may have a duration of between about 1 μS and about 1000 to a current value of about 80 μA. The third ramp period 104 may have a duration of between about 1 μS and about 1000 to a current value of about 100 μA. Persons of ordinary skill in the art will recognize that these durations and current values are nominal only and that the pulse widths, ramp durations and amplitudes to be selected for any given ReRAM device will depend on the number of pulses to be employed, the device geometry and characteristics of the ReRAM device being programmed, including the thickness and composition of the solid electrolyte as well as the composition of the metal layer ion source that will be used to form the conductive filament through the solid electrolyte. Such skilled persons will appreciate that these selections will be routine, as they are a normal component of performing the device characterizations of the ReRAM devices.

According to the aspects of the present invention in FIGS. 11B and 11C, the voltage bias applied to the WLS line is a variable ramp voltage bias such that the e-field at the beginning of the next pulse ramps up slowly enough so as not to apply too high of an e-Field to the ReRAM device to allow the metal ions driven by the e-Field to diffuse through the solid electrolyte layer at a rate that does not overstress the ReRAM structure. Thus the current limit reaches a maximum as the metal filament reaches its lowest resistance. Hence the WLS Bias voltage applied to the source of the programming transistor is a ramped voltage starting in concert with each current pulse. This bias for programming always has the most positive voltage applied to the metal ion source of the ReRAM structure so as to drive the positively charged metal ions to the opposite side to lower the resistance of the on state.

In yet another aspect of this invention as also illustrated in FIG. 11C, the sequence of separate programming pulses can be merged such that the end of the first pulse 94 instead of returning to zero potential across the ReRAM device will in fact begin the ramp 96 to the next higher current level 98.

In the case of programming ReRAM device 44 in FIG. 10, the current limiting device can be either transistor 62 or 54. Preferably, transistor 54 provides the current limit. This is due to the fact that as the current begins to flow an IR drop across transistor 62 will reduce the $V_{gate}$ to $V_{source}$ potential of transistor 54 thereby reducing the current limit and reducing the stress on the device as it nears the end of the programming pulse.

According to another aspect of the present invention, the characteristics of the population of ReRAM devices on the wafer can be determined at wafer sort and constants can then be loaded into the individual die defining the number and amplitude of the pulses, as well as ramp rates, to be used to program the devices.

Figure 12:
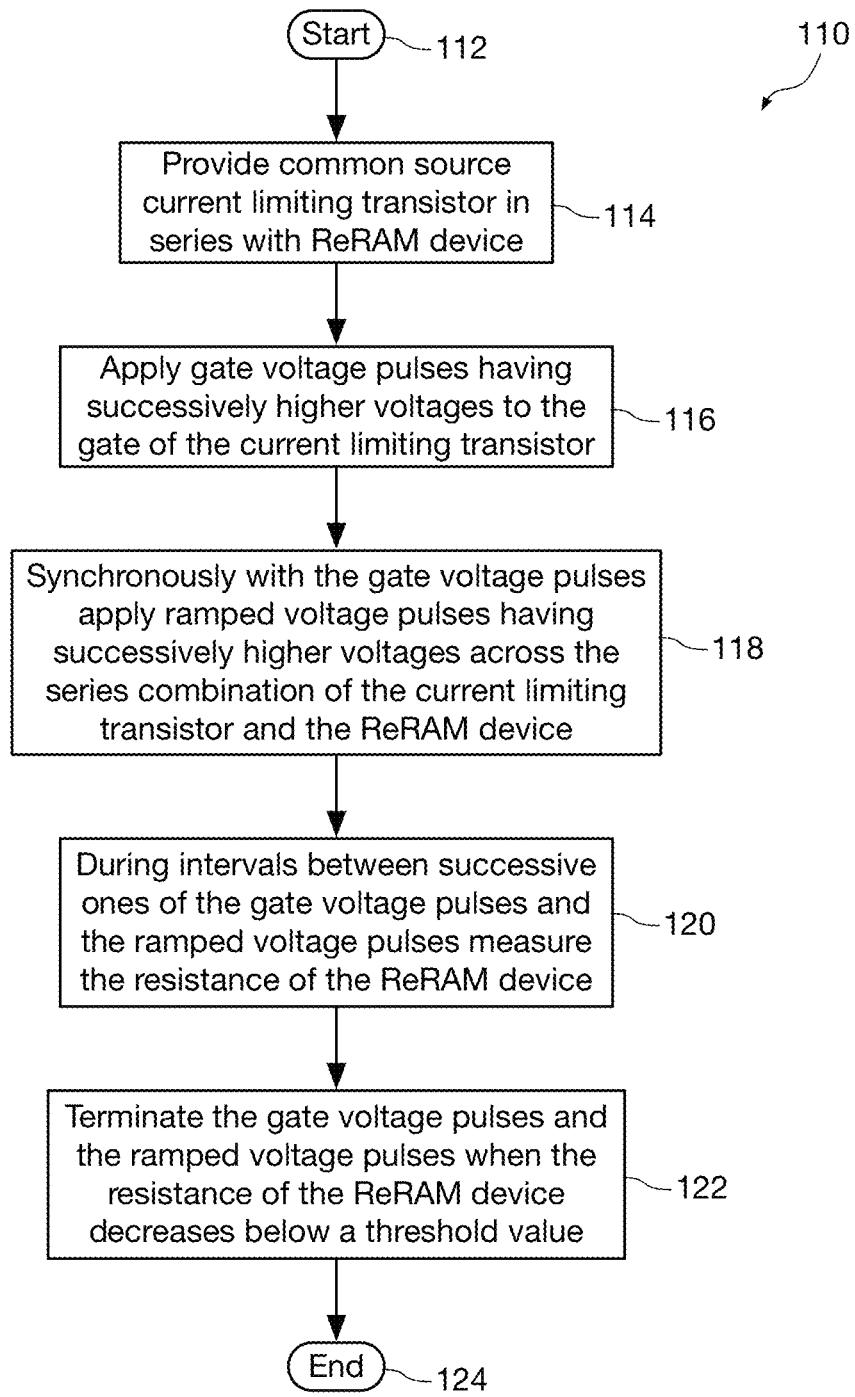
FIG. 12 is a flow diagram showing an illustrative programming method in accordance with the present invention.

Referring now to FIG. 12 a flow diagram shows an illustrative programming method 110 in accordance with the present invention. Such a method may be accomplished by a control circuitry in communication with the various bit and word lines. Such a control circuitry may be implemented in an external programmer, or internally as part of the control circuit of an integrated circuit such as an FPGA. The method begins at reference numeral 112. At reference numeral 112, a common source current limiting transistor is provided in series with ReRAM device. This is shown in FIG. 4A, as well as FIGS. 8 and 10 where the series combination of ReRAM device 12 and n-channel transistor 14 (FIG. 4A), ReRAM device 42 and p-channel transistor 50 (FIG. 8), and ReRAM device 44 and n-channel transistor 54 (FIG. 10).

At reference numeral 116, and as shown in FIG. 11A, gate voltage pulses having successively higher voltages are applied to the gate of the current limiting transistor. At reference numeral 118 ramped voltage pulses having successively higher voltages are applied across the series combination of the current limiting transistor and the ReRAM device synchronously with the gate voltage pulses. FIGS. 11B and 11C show examples of such ramped voltage pulses.

At reference numeral 120 the resistance of the ReRAM device is measured during intervals between successive ones of the gate voltage pulses and the ramped voltage pulses. At reference numeral 122, the gate voltage pulses and the ramped voltage pulses are terminated when the resistance of the ReRAM device decreases below a threshold value. The method ends at reference numeral 124.

The present invention improves the endurance of a typical ReRAM memory cell on an integrated circuit. FIG. 13A is a plot showing the distribution of on and off resistances of a typical ReRAM cell over a 2,000-cycle endurance test when the cell is programmed in accordance with prior-art techniques that limit programming current using the circuit and techniques shown in FIG. 1A that are insufficient to guarantee avoiding damage to the solid electrolyte later of the ReRAM device. The gate of access transistor 14 is set to 0.9V (i.e. access transistor 14 is simply turned on) and the WLS bias voltage is ramped at, for example, 0.6 V/second.

A good number of cells do not end up in a determinate state. Those cells may be "fixed" in the next programming cycle, however this does not solve the problem of overstress causing stuck bits.

FIG. 13B is a plot showing the distribution of on and off resistances of a typical ReRAM cell of the type depicted in FIG. 4A over a 2,000-cycle endurance test when the cells are programmed in accordance with the principles of the present invention using an initial controlled current pulse formed with the gate of access transistor 14 initially set to 0.5V and a later full pulse is provided with gate of access transistor 14 set to 0.9V (i.e. re-channel access transistor 14 is simply turned on) and the bias voltage is ramped more slowly at, for example, 0.06 V/second. For any given actual design, the maximum ramp rate should be determined empirically to be slow enough to avoid damage to the solid electrolyte layer of the ReRAM device used in the design. It can be seen that significantly fewer cells end up in an indeterminate state.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A ReRAM cell comprising:
an output node coupled to a current source;
a ReRAM device having an ion source end and a solid electrolyte end, the ion source end coupled to the output node; and
an access transistor coupled between a first bitline associated with the memory cell and the solid electrolyte end of the ReRAM device, the access transistor having a gate coupled to a wordline associated with the memory cell.

2. The ReRAM cell of claim 1 wherein the current source comprises a current source transistor coupled to a second bitline associated with the memory cell.

3. The ReRAM cell of claim 1 wherein the access transistor comprises an n-channel transistor.

4. The memory cell of claim 1 wherein the current source comprises at least a p-channel transistor.

* * * * *

UNITED STATES PATENT AND TRADEMARK OFFICE
CERTIFICATE OF CORRECTION

| | |
|---|---|
| PATENT NO. | : 10,522,224 B2 |
| APPLICATION NO. | : 16/037417 |
| DATED | : December 31, 2019 |
| INVENTOR(S) | : John L. McCollum |

It is certified that error appears in the above-identified patent and that said Letters Patent is hereby corrected as shown below:

In the Specification

Column 2, Line 7, Column 5, Line 36, Column 7, Line 61 and Column 8, Line 61, replace "re-channel" with --n-channel"--.

Column 12, Line 20 and Column 12, Line 22, replace "1000" with --100µS--.

Signed and Sealed this
Eighteenth Day of February, 2020

Andrei Iancu
*Director of the United States Patent and Trademark Office*